(12) United States Patent
Chau et al.

(10) Patent No.: US 6,952,040 B2
(45) Date of Patent: Oct. 4, 2005

(54) TRANSISTOR STRUCTURE AND METHOD OF FABRICATION

(75) Inventors: Robert S. Chau, Beaverton, OR (US); Jack Kavalieros, Portland, OR (US); Anand Murthy, Portland, OR (US); Brian Roberds, Beaverton, OR (US); Brian S. Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/895,697

(22) Filed: Jun. 29, 2001

(65) Prior Publication Data

US 2003/0001219 A1 Jan. 2, 2003

(51) Int. Cl.[7] .......................... H01L 29/76; H01L 29/94; H01L 31/062; H01L 31/113
(52) U.S. Cl. ........................................ 257/412; 257/347
(58) Field of Search ................................ 257/346, 347, 257/354, 382, 387, 412, 352, 383; 438/300

(56) References Cited

U.S. PATENT DOCUMENTS

| | | | | | |
|---|---|---|---|---|---|
| 5,079,180 A | * | 1/1992 | Rodder et al. | ................. | 437/44 |
| 5,124,768 A | * | 6/1992 | Mano et al. | ................. | 257/347 |
| 5,164,805 A | * | 11/1992 | Lee | .............................. | 257/351 |
| 5,279,978 A | * | 1/1994 | See et al. | ...................... | 437/34 |
| 5,293,053 A | * | 3/1994 | Malhi et al. | ................. | 257/330 |
| 5,362,660 A | * | 11/1994 | Kwasnick et al. | ............ | 437/40 |
| 5,434,093 A | * | 7/1995 | Chau et al. | ..................... | 437/41 |
| 5,583,368 A | * | 12/1996 | Kenney | ...................... | 257/621 |
| 5,625,217 A | | 4/1997 | Chau et al. | | |
| 5,627,097 A | * | 5/1997 | Venkatesan et al. | ......... | 438/217 |
| 5,643,817 A | * | 7/1997 | Kim et al. | ..................... | 437/51 |
| 5,663,570 A | * | 9/1997 | Reedy et al. | ................... | 257/9 |
| 5,710,450 A | * | 1/1998 | Chau et al. | ................. | 257/344 |
| 5,714,413 A | * | 2/1998 | Brigham et al. | ............ | 438/301 |
| 5,783,478 A | * | 7/1998 | Chau et al. | ................. | 438/592 |
| 5,998,289 A | * | 12/1999 | Sagnes | ....................... | 438/592 |
| 6,239,472 B1 | * | 5/2001 | Shenoy | ........................ | 257/408 |
| 6,254,676 B1 | * | 7/2001 | Yang et al. | .................... | 117/95 |
| 6,271,551 B1 | * | 8/2001 | Schmitz et al. | ............. | 257/288 |
| 6,424,016 B1 | | 7/2002 | Houston | | |
| 2002/0020861 A1 | * | 2/2002 | Ohmi et al. | ................. | 257/268 |
| 2002/0119615 A1 | * | 8/2002 | Kim et al. | .................... | 438/201 |

* cited by examiner

*Primary Examiner*—Mary Wilczewski
*Assistant Examiner*—Monica Lewis
(74) *Attorney, Agent, or Firm*—Blakely, Sokoloff, Taylor & Zafman LLP (57) ABSTRACT

A novel transistor structure and its method of fabrication. According to the present invention, the transistor includes an intrinsic silicon body having a first surface. A gate dielectric is formed on the first surface of the intrinsic silicon body. A gate electrode is formed on the gate dielectric wherein the gate electrode comprises a mid-gap work function film on the gate dielectric. A pair of source/drain regions are formed on opposite sides of the intrinsic silicon body.

8 Claims, 5 Drawing Sheets

TRANSISTOR STRUCTURE AND METHOD OF FABRICATION

BACKGROUND OF THE INVENTION

1. Field of the Invention

The present invention relates to the field of semiconductor integrated circuits, and more specifically, to the ultra large-scale fabrication of submicron transistors.

2. Discussion of Related Art

Today literally millions of individual transistors are coupled together to form very large-scale integrated (VLSI) circuits, such as microprocessors, memories, and applications specific integrated circuits (ICs). Presently, the most advanced ICs are made up of approximately three million transistors, such as metal oxide semiconductor (MOS) field effect transistors having gate lengths on the order of 0.5 μm. In order to continue to increase the complexity and computational power of future integrated circuits, more transistors must be packed into a single IC (i.e., transistor density must increase). Thus, future ultra large-scale integrated (ULSI) circuits will require very short channel transistors with effective gate lengths less than 0.1 μm. Unfortunately, the structure and method of fabrication of conventional MOS transistors cannot be simply "scaled down" to produce smaller transistors for higher density integration.

Figure 1:
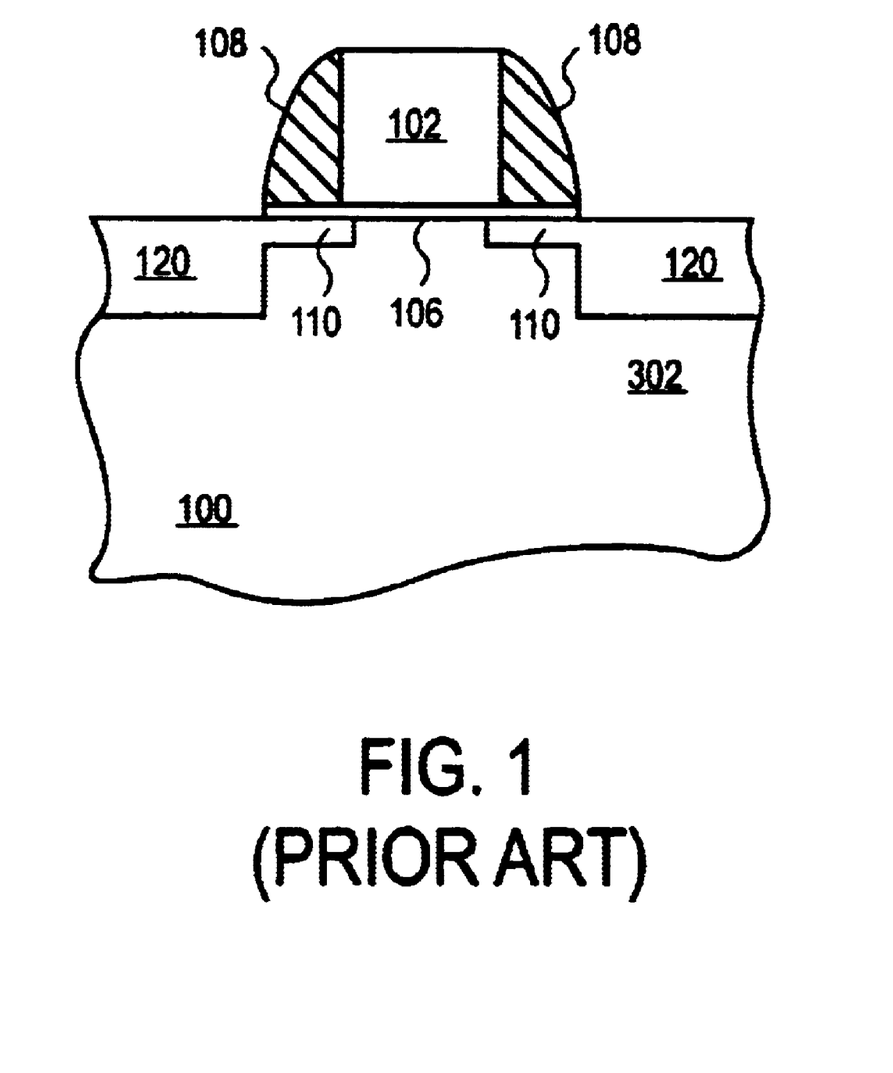
FIG. 1 is an illustration of a cross-sectional view of a conventional transistor.

The structure of a conventional MOS transistor 100 is shown in FIG. 1. Transistor 100 comprises a gate electrode 102, typically polysilicon, formed on a gate dielectric layer 104 which in turn is formed on a silicon substrate 106. A pair of source/drain extensions or tip regions 110 are formed in the top surface of substrate 106 in alignment with outside edges of gate electrode 102. Tip regions 110 are typically formed by well-known ion implantation techniques and extend beneath gate electrode 102. Formed adjacent to opposite sides of gate electrode 102 and over tip regions 110 are a pair of sidewall spacers 108. A pair of source/drain regions 120 are then formed, by ion implantation, in substrate 106 substantially in alignment with the outside edges of sidewall spacers 108.

As the gate length of transistor 100 is scaled down in order to fabricate a smaller transistor, the depth at which tip region 110 extends into substrate 106 must also be scaled down (i.e., decreased) in order to improve punchthrough characteristics of the fabricated transistor. Unfortunately, the length of tip region 110, however, must be larger than 0.07 μm to insure that the later, heavy dose, deep source/drain implant does not swamp and overwhelm tip region 110. Thus, in the fabrication of a small scale transistor with conventional methods, as shown in FIG. 1, the tip region 110 is both shallow and long. Because tip region 110 is both shallow and long, tip region 110 exhibits substantial parasitic resistance. Parasitic resistance adversely effects (reduces) the transistors drive current.

DETAILED DESCRIPTION OF THE PRESENT INVENTION

A novel transistor and its method of fabrication is described. In the following description numerous specific details are set forth, such as specific materials, dimension and processes etc., in order to provide a thorough understanding of the present invention. It will be obvious, however, to one skilled in the art that the invention may be practiced without these specific details. In other instances, well-known semiconductor equipment and processes have not been described in particular detail in order to avoid unnecessarily obscuring the present invention.

The transistor of the present invention includes a silicon on insulator substrate with an ultra thin body of less than 500 nanometers which is ideal for sub-threshold slope and device scalability. Additionally, the transistor channel is formed of intrinsic or undoped epitaxial silicon which provides a transistor with high mobility and minimal threshold voltage (Vt) fluctuation. The present invention includes a polysilicon/mid-gap metal composite gate electrode for pinning the threshold voltage and eliminating poly depletion. Additionally, the CMOS structure can include a raised tip and raised source/drain architecture for low external parasitic resistance. The novel transistor structure of the present invention is ideal for low Vdd (less than 1.0 volts) and low power applications for 70 nanometer technology and beyond. The device has zero poly depletion, ideal sub-threshold slope, zero dopant fluctuation and very low external resistance.

Figure 2:
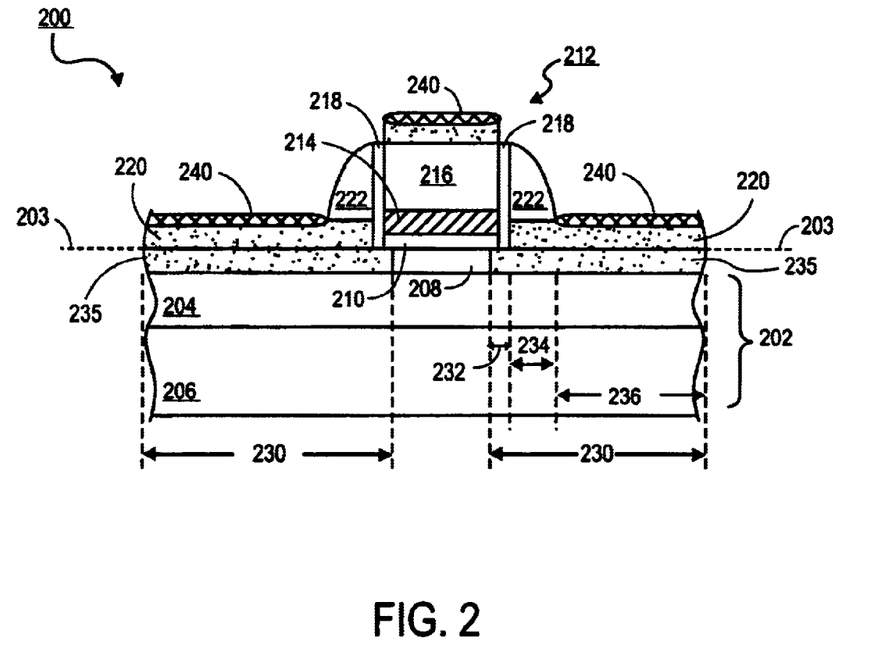
FIG. 2 is an illustration of a cross-sectional view of a transistor in accordance with the present.

A novel transistor 200 in accordance with the present invention, is illustrated in FIG. 2. Transistor 200 is formed on an insulating substrate 202. In an embodiment of the present invention, the insulating substrate comprises an oxide film 204, such as silicon dioxide, formed on a monocrystalline silicon substrate 206. In other embodiments the insulating substrate can be other insulating substrates such as, for example, diamond, sapphire, quartz, non conducting polymers, gallium arsinide, and wide band gap semiconductors. Transistor 200 includes a very thin intrinsic or undoped epitaxial silicon body or channel 208 formed on insulating substrate 202. The thickness of the intrinsic or undoped silicon body is less than 500 Å and preferably less than 100 Å and ideally less than 30 Å. In an embodiment of the present invention, the thin silicon body is at most very slightly doped to a concentration of less than $1 \times 10^{15}$ atmos/cm$^3$. Ideally, however, intrinsic silicon body is completely undoped and has no carriers other than the intrinsic carriers of approximately than $1 \times 10^{14}$ atom/cm$^3$. A gate dielectric layer 210, such as but not limited to a silicon dioxide film or a silicon oxynitride film, is formed directly onto the top surface 203 of intrinsic silicon body 208. In an embodiment of the present invention, the gate dielectric 210 is a nitrided oxide film having a thickness less than 50 Å and preferably less than 15 Å.

A gate electrode 212 is formed directly on gate dielectric layer 210. Gate electrode 212 is a composite electrode having a mid-gap work function film 214 formed directly on gate dielectric 210 and a heavily doped polysilicon film 216 formed on the midgap work function film 214 as shown in FIG. 2. Mid-gap work function film 214 has a work function close to the mid-gap of silicon (i.e., between the work function of n+ ploy (approximately 4.2 eV) and p+ poly (approximately 5.2 eV)) and preferably has a work function between 4.65 eV to 4.9 eV. Examples of suitable mid-gap work function films include but are not limited to titanium nitride (TiN), tungsten (W), titanium (Ti), molybdenum (Mo), tantalum (Ta), polycrystalline carbon, and metallic silicides, such as titanium silicide. In a preferred embodiment of the present invention, the mid-gap work function film is titanium nitride. In an embodiment of the present invention, the mid-gap work function film 214 has a thickness less than 100 Å and can have a thickness as thin as one monolayer or about 3–5 Å. The polycrystalline silicon film 216 can have a thickness of approximately 1000 Å.

A pair of thin sidewall spacers 218 having a width of 100 Å or less is formed along opposite sides of gate electrode 212 as shown in FIG. 2. Spacers 218 electrically isolate gate electrode 212 from a doped silicon or silicon alloy film 220 used to form raised tip 232 and raised source/drain contact regions 236. Sidewall spacers can be formed from a dielectric film, such as but not limited to silicon dioxide and silicon nitride. Transistor 200 can also include a second pair of sidewall spacers 222 formed adjacent to the outside edges of first sidewall spacers 218. The second pair of sidewall spacers 222 are wider than the first pair of sidewall spacers 218 and in an embodiment of the present invention have a width of between 500–1500 Å. The second pair of sidewall spacers 222 are used to define the raised tip region and the contact regions and can be used to prevent silicide encroachment when forming silicide on the contact regions in a salicide process.

Transistor 200 includes a pair of source/drain regions 230 formed along opposite sides of intrinsic silicon body or channel 208 as shown in FIG. 2. Each source/drain region 230 includes an ultra shallow tip or extension region 232, a raised tip or extension region 234, and a raised contact region 236. The ultra shallow tip portion 232 is formed of doped epitaxial silicon 235 formed by out diffusion of dopants into the intrinsic silicon beneath the first pair of sidewall spacers and slightly beneath the outside edges of gate electrode 212 as shown in FIG. 2. The ultra shallow tip regions 232 typically extend at least 100 Å beneath (laterally) gate electrode 212 for a transistor with an effective gate length of less than 0.1 microns (or 1000 Å). Additionally, ultra shallow tip region 232 has a thickness which extends from beneath gate dielectric 210 to insulating substrate 202. Raised tip region 234 is located beneath second sidewall spacer 222 and is adjacent to the outside edges of first sidewall spacer 218. Raised tip region 234 is formed of a doped silicon or silicon alloy 220 selectively deposited onto the intrinsic silicon film used to form intrinsic body 208. Additionally, raised tip extension region 234 includes a portion 235 doped by "out diffusing" dopants from the selectively deposited silicon or silicon alloy into the underlying intrinsic silicon film. Because a portion of the raised tip region 234 is formed above semiconductor substrate surface 203 on which the gate dielectric layer 210 is formed, raised tip region 234 is said to be "raised". A raised tip region significantly reduces the parasitic resistance of transistor 200 and thereby improves its performance.

Transistor 200 can also include a pair of source/drain contact regions 236 form adjacent to the outside edge of second sidewall spacers 222. Source/drain contact regions 236 comprise selectively deposited silicon or silicon alloy 220 and "out diffusion" doped intrinsic silicon region 235. Source/drain contact regions are raised contact regions. Silicide 240 can preferably be formed on source/drain contact regions 236 in order to help reduce the contact resistance of transistor 200. Additionally, silicide 240 is also preferably formed on silicon or silicon alloy film 220 on gate electrode 212. Both raised contact region 236 and raised tip or extension region 234 and shallow tip region extend down to insulating substrate 202.

The transistor 200 of the present invention has high mobility because the channel 208 is undoped or intrinsic silicon. Additionally, transistor 200 has a very steep sub-threshold slope which gives the transistor good short channel effects which improves the devices scalability. The transistor 200 of the present invention has a low threshold voltage (Vt) because the channel or body 208 of the transistor is undoped or intrinsic silicon. The use of a mid-gap work function film as the lower layer of the gate electrode has the effect of raising the threshold voltage of the device which is necessary because of the use of intrinsic or undoped silicon for the body. A low threshold voltage is desirable for low operating voltages (Vcc) or less than 1.0 volt and low power operations because the drive current ($I_d$) of transistor 200 is proportional to the operating voltage (Vcc) minus the threshold voltage ($V_t$). Additionally, because transistor 200 has a thin channel body 208, transistor 200 has a steep threshold slope which gives the transistor 200 a low off current (Ioff). A low off current (Ioff) is necessary to operate a transistor with a low threshold voltage. In current MOS transistors, if $V_t$ is too low the off current is unacceptably high.

Additionally, the transistor of the present invention does not suffer from threshold voltage fluctuations because of the use of intrinsic silicon or undoped silicon body. Since there are no dopants in the channel region 208 of the device, the dopant concentration from transistor to transistor across the wafer or substrate does not vary and each device has the same threshold voltage which is determined by the type of mid-gap work function metal 214 used in the gate electrode. Additionally, the use of raised tip and raised source/drain contact regions has the effect of making for low external parasitic resistance for the device. It is to be appreciated that if the tip region 234 and the source/drain contact regions 236 were not raised the device would suffer from high parasitic resistance due to the thinness (less than 500 Å) of the epitaxial silicon film formed on the insulating substrate. Additionally, because a metal film is used as the lower layer in the gate electrode of the device, the device does not suffer from poly depletion effects. (Poly depletion effects are caused by not having enough dopants in the lower portion of a polysilicon film when polysilicon is used to form the gate electrode of a device).

As such, the features of the present invention such as a thin channel or body, an intrinsic epitaxial silicon channel, a mid-gap work function gate electrode, raised tip and source/drain contact regions, all work in combination with one another to produce a device which is characterized by high mobility, minimal Vt fluctuation, low external parasitic resistance, no poly depletion, steep sub-threshold slope, and good device scalability making the transistor 200 of the present invention ideal for use in low voltage and low power operations in 70 nanometer technology and beyond.

Figure 3A:
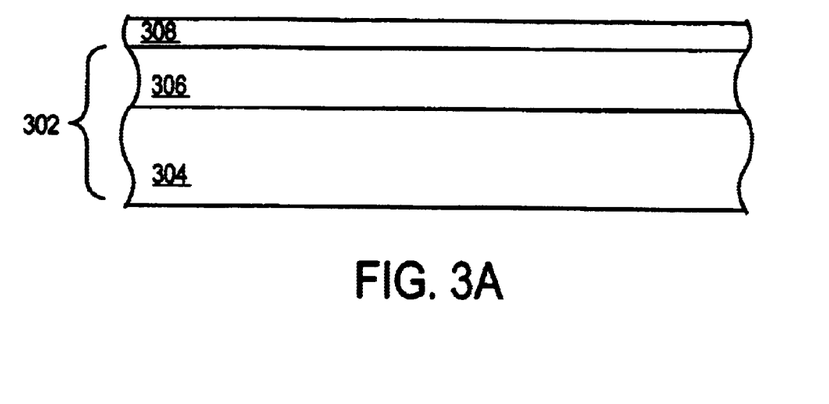
FIG. 3A-3G illustrates a method of fabricating a transistor in accordance with the present invention.

Illustrated in FIG. 3A-3G is a method of fabricating the transistor of the present invention. The transistor of the present invention is fabricated on an insulating substrate 302 as shown in FIG. 3A. In an embodiment of the present invention, insulating substrate 302 includes a lower monocrystalline silicon substrate 304. Formed on the monocrystalline silicon substrate 304 is an insulating oxide 306 having a thickness greater than or equal to 1000 Å. Alternatively, insulating substrate 302 can be other types of insulating substrates, such as but not limited to a graphite substrate, a diamond substrate, a sapphire substrate, a quartz substrate, or a gallium arsinide substrate. Formed on top of insulating substrate 302 is a thin intrinsic silicon epitaxial film 308. Intrinsic silicon epitaxial film 308 is formed thin and has a thickness less than 500 Å and preferably less than 100 Å and ideally less than 30 Å. Intrinsic silicon epitaxial film 308 is preferably undoped silicon which has not been intentionally doped with impurities. If intrinsic epitaxial silicon film 308 is doped, it is only very slightly doped to a concentration less than $1\times10^{15}$ atoms/cm$^3$. If intrinsic epitaxial silicon layer 308 is slightly doped, it would be doped with a conductivity type with is opposite the conductivity type of which the source/drain regions will be formed. A substrate as shown in FIG. 3A having a silicon epitaxial film 308 formed on an oxide 306 is known as a "silicon on insulator" (SOI) substrate. Intrinsic epitaxial silicon film 308 is used to form the thin body or channel of the transistor of the present invention.

Figure 3B:
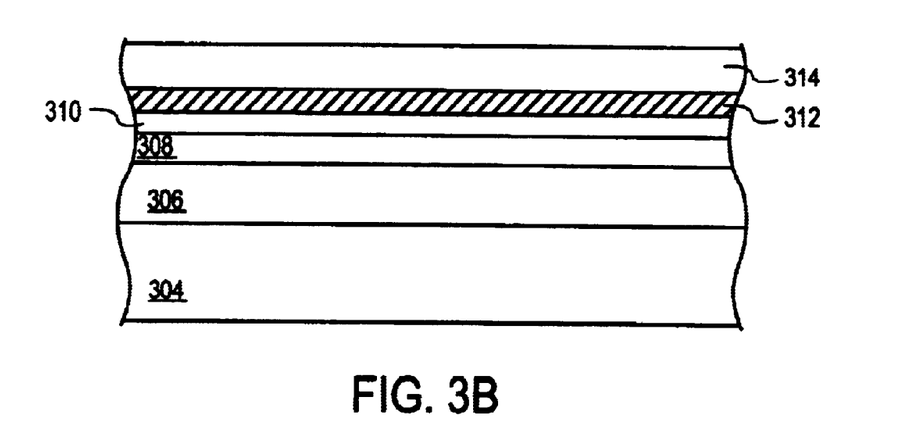

Next, as shown in FIG. 3B, a gate dielectric layer 310 is formed directly on intrinsic silicon body 308. In an embodiment of the present invention, gate dielectric layer 310 is a nitrided oxide layer formed to a thickness between 15–30 Å. It is to be appreciated that other well-known gate dielectrics, such as oxides, nitrides, and combinations thereof may be utilized, if desired. In an embodiment of the present invention, the gate dielectric is a thermal oxide which is grown by heating the substrate in an oxygen ambient. The thermal oxide is then nitrided utilizing a remote plasma nitridation process. Next, as also shown in FIG. 3B, a metal film 212 having a mid-gap work function is deposited directly onto dielectric layer 310. Mid-gap work function film 312 has a work function between n+ polysilicon (4.2 eV) and p+ polysilicon (5.2 eV). In an embodiment of the present invention, mid-gap work function film 312 has a work function between 4.65 eV to 4.9 eV. In an embodiment of the present invention, the mid-gap work function film is titanium nitride and can be formed by well-known techniques such as sputtering or chemical vapor deposition (CVD). Other suitable mid-gap work function films include but are not limited to tungsten, titanium, molybdenum, tantalum, and metallic silicides. Mid-gap work function metal 312 is preferably formed to a thickness of less than 100 Å. Next, a polycrystalline silicon film 314 is blanket deposited over and directly onto mid-gap work function film 312 as shown in FIG. 3B. Polysilicon film 314 can be formed with well-known techniques to a thickness of approximately 1000 Å. The polysilicon film 314 can be doped during the deposition (i.e., insitu doped) or can be doped by ion-implanting after the formation of film 314, or can be subsequently doped during the source/drain doping of the transistor.

Figure 3C:
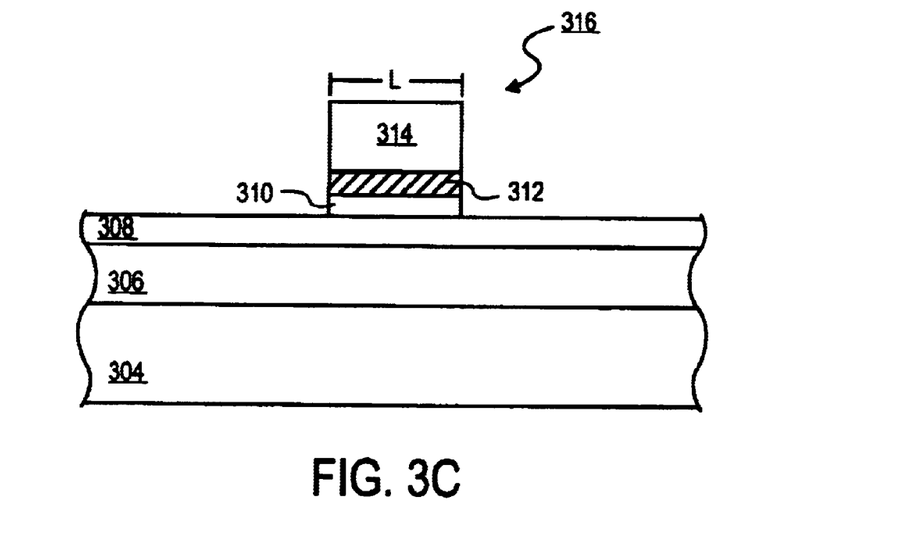

Next, polysilicon film 314, mid-gap work function film 312, and gate dielectric layer 310 are patterned with well-known photolithography and etching techniques to form a gate electrode 316 from polysilicon film 314 and mid-gap work function film 312.

It is to be appreciated that other well-known patterning techniques may be utilized to pattern polysilicon film 314 and mid-gap dielectric film 312 including submicronlithography techniques, such as ebeam and x-ray, and sublithographic patterning techniques such as described in U.S. Pat. No. 5,434,093 entitled INVERTED SPACER TRANSISTOR and assigned to the present assignee. In an embodiment of the present invention, gate electrode 316 has a drawn length ("L") of 100 nanometers or less and preferably 70 nanometers or less.

Figure 3D:
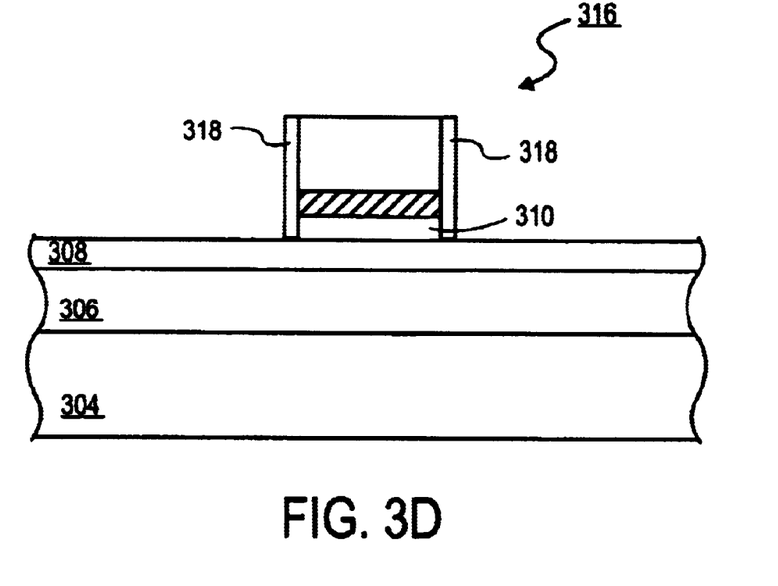

Next, as shown in FIG. 3D, a pair of thin dielectric sidewall spacers 318 are formed on intrinsic silicon film 308 and along opposite sidewalls of gate electrode 316. Sidewall spacers 318 can be formed to a thickness between 50–150 Å with 100 Å being preferred. Sidewall spacer 318 can be formed with well-known techniques such as by blanket depositing a dielectric layer used to form the spacers over the entire substrate including intrinsic silicon layer 308 and gate electrode 316 to a thickness desired for the width of the sidewall spacers 318, and then anisotropically etching the dielectric film to remove the dielectric from horizontal surfaces and leaving sidewall spacers 318 adjacent to laterally opposite sidewalls of gate electrode 316. It is to be appreciated that spacers 318 must have a width sufficient to electrically isolate a subsequently deposited silicon or silicon alloy film from gate electrode 306. Additionally, the width of the silicon nitride spacers 318 defines the minimum length of the ultra shallow tip portion of the fabricated transistor.

In an embodiment of the present invention, sidewall spacers 318 are formed by a "hotwall" process to provide a very hermetic seal of gate electrode 316 and the edges of gate dielectric 310. Additionally, although hotwall silicon nitride spacers 318 are preferred in the present invention because of the hermetic seal, any other suitable insulating layer such a deposit oxide can be used, if desired. A silicon nitride layer 314 can be formed by a low pressure chemical vapor deposition (LPCVD) process by reacting ammonia (NH$_3$) and dichlorosilane (DCS) at a pressure of approximately 10 pascals and at a temperature of approximately 800° C. A silicon nitride film can be anisotropically etched using chemistry comprising C$_2$F$_6$ and a power of approximately 200 watts.

Figure 3E:
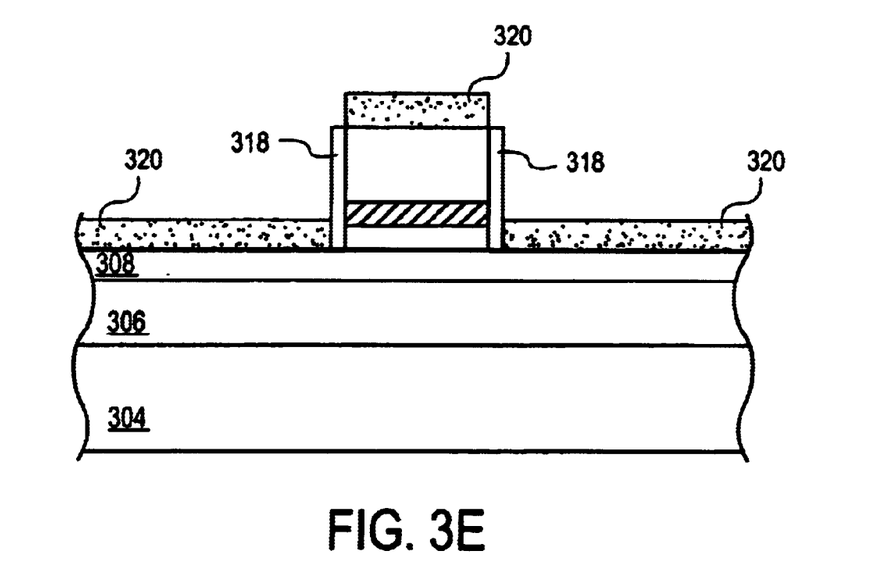

Next, as shown in FIG. 3E, a silicon or silicon alloy film 320 is selectively deposited onto intrinsic silicon film 308 adjacent to the outside edges of sidewall spacer 318. Silicon or silicon alloy film 320 is selectively deposited so that it forms only on exposed silicon, such as intrinsic silicon 308 and the top of polysilicon film 314. Silicon or silicon alloy is not deposited onto thin spacers 318. Thin spacers 318 electrically isolate silicon or silicon alloy film from gate electrode 316. By forming silicon or silicon alloy film 320 onto intrinsic silicon film 308, silicon or silicon alloy 320 is formed above the surface on which gate dielectric layer 310 is formed, a "raised" tip is formed which increases the conductivity of the tip which in turn improves the device performance. By forming a raised tip in the present invention, shallow tips can be formed and good punch-through characteristics obtained. The silicon or silicon alloy 320 is doped with p type impurities for a PMOS device or with n type impurities for an NMOS device to a concentration level between $1\times10^{18}$/cm$^3$ to $5\times10^{20}$/cm$^3$ with a concentration of approximately $1\times10^{20}$/cm$^3$ being preferred. The silicon or silicon alloy can be insitu doped during deposition or subsequently doped by ion implantation. In an embodiment of the present invention, the silicon or silicon alloy 320 is epitaxial silicon germanium and is insitu doped.

According to an embodiment of the present invention, silicon or silicon alloy film 320 is preferably a silicon germanium semiconductor alloy with germanium comprising approximately 10–50% of the alloy. A silicon germanium semiconductor alloy can be formed by decomposition of approximately 20 sccm of dichlorosilane, approximately 130–180 sccm of 1% hydrogen diluted germanium (GeH$_4$) at a temperature of between 600–800° C. with 700° C. being preferred and a power of approximately 20 torrs. If desired, a p type dopant source or an n type dopant source may be included into the gas mix to insitu dope the silicon alloy during deposition. Alternatively, the silicon or silicon alloy can be ion-implanted to the desired conductivity after the deposition of the silicon or silicon alloy film. In order to increase the selectivity of the deposition process, approximately 25–50 sccm of HCo can be added to the gas composition, if desired.

A silicon germanium alloy is preferred because it exhibits good selectivity to silicon during deposition. Additionally, such silicon germanium alloy exhibits many microscopic "faults" and "dislocations" which aid in the solid state diffusion of dopants through the alloy 320. It is to be appreciated that any silicon or silicon alloy or any semiconductor for that matter which can be selectively deposited can be used to form silicon or silicon alloy 320. For example, silicon or silicon alloy 320 can be selectively deposited polycrystalline silicon formed from dichlorosilane and HCo in an $H_2$ ambient at a temperature between 600–900° C. or can be selectively deposited single crystalline silicon (epitaxial silicon) formed by any well-known technique. Additionally, silicon or silicon alloy film 320 can be a semiconductor such as germanium (Ge). Prior to the selective deposition of silicon or silicon alloy 320 one can utilize a 600–900° C. bake in an $H_2$ ambient to remove native oxides from the exposed silicon/polysilicon areas.

It is to be appreciated that the thickness and doping concentration level of silicon or silicon alloy 320 determines the resistivity of the raised tip portion of the fabricated transistor. A thicker and higher doped silicon or silicon alloy 320 results in a transistor with lower parasitic resistance. An adverse capacitance (i.e., miller capacitance) however, can be developed when opposite voltages are placed on the gate electrode 316 and the silicon or silicon alloy 320. The higher the doping and the thicker the silicon or silicon alloy source/drain regions 320 is, the greater is the miller capacitance. Thus, tradeoffs must be made between the transistors parasitic resistance and its miller capacitance. In an embodiment of the present invention, silicon or silicon alloy film 320 is formed to a thickness between 500–1000 Å.

Figure 3F:
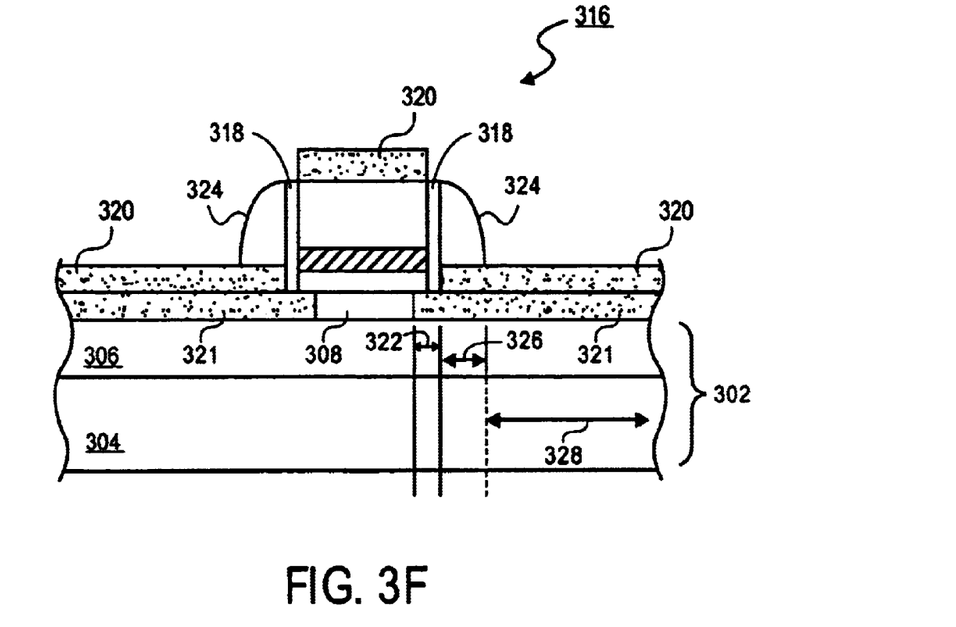

Next, as shown in FIG. 3F, a pair of thick sidewall spacers 324 are formed on silicon or silicon alloy 320 adjacent to the outside edges of thin sidewall spacers 318 and run along laterally opposite sidewalls of gate electrode 316. Sidewall spacers 324 are substantially wider than sidewall spacers 318 and have a width of between 500–1800 Å with 800 Å being preferred. Sidewall spacers 324 are formed from a dielectric material, such as but not limited to silicon nitride or silicon dioxide. Alternatively, spacer 324 can be formed from a composite film comprising a lower oxide layer and a upper nitride layer. The purpose of sidewall spacers 324 is to prevent the encroachment of a subsequently formed silicide on the gate electrode from shorting to the subsequently formed silicide on the source/drain regions. Spacers 324 should be formed wide enough so as to prevent such encroachment during a self-aligned silicide process. Additionally, sidewall spacers 324 can be used to mask a high dose implant to further increase the doping concentration in silicon or silicon alloy 320 in the source/drain contact regions.

Next, as also shown in FIG. 3F, dopant impurities in silicon or silicon alloy 320 are diffused out from the silicon or silicon alloy 320 and into the intrinsic silicon 308 to form a diffusion doped silicon region 321. The out diffusion of impurities from silicon or silicon alloy 320 forms diffusion doped silicon region 321 with a concentration level of approximately equal to the deposited silicon or silicon alloy 320. Impurities are diffused laterally horizontally beneath the first thin sidewall spacers 318 until impurities extend at least 100 Å (laterally) beneath the outside edges of gate electrode 316. The portion of the diffusion doped silicon region 321 which laterally extends beneath the first pair of sidewall spacers 318 and gate electrode 316 is the ultra shallow tip portion 322 of the transistor. It is to be appreciated that the alt diffusion of impurities also diffuses impurities deeper (i.e. vertically) into intrinsic silicon 308. For each 150 Å of lateral diffusion, dopants diffuse about 150 Å vertically into intrinsic silicon 308. In the present invention, impurities are diffused through the entire thickness of intrinsic silicon 308 until oxide layer 306 of insulating substrate 302 is reached. In this way the entire intrinsic silicon region 308 in the source/drain regions is formed into out diffusion doped silicon region 321.

Additionally, the transistor has a tip with a raised tip portion 326 comprising silicon or silicon alloy 320 and out diffusion doped silicon region 321. Additionally, the out diffusion creates a transistor having a source/drain contact region 328 comprising silicon or silicon alloy 320 and out diffusion doped silicon region 321, as shown in FIG. 3F. Additionally, it is to be appreciated that the remaining intrinsic silicon 308 located between the ultra shallow tip regions 322 forms the channel of the fabricated transistor.

In an embodiment of the present invention, an anneal using a rapid thermal process (RTP) is utilized to diffuse impurities from silicon or silicon alloy 320, into intrinsic silicon 308 to form diffusion doped silicon regions 321. In an embodiment of the present invention, the RTP is a two-step rapid-thermal anneal. In the first step the substrate is heated to a temperature of approximately 500 to 700° C., with 600° being preferred in an ambient comprising approximately 5 to 10% t $O_2$ with 10% $O_2$ preferred and 95% to 80% $N_2$, with 90% $N_2$ preferred for approximately 20 to 60 seconds with 30 seconds being preferred. Because oxygen is included in the ambient during the first step of the RTP, a thin oxide capping layer, (not shown) is formed on silicon or silicon alloy 320. The thin oxide capping layer prevents dopant loss (i.e. out diffusion of dopants into the ambient) during the anneal. In this way the doping concentrations of the source/drain regions can be accordingly controlled and low parasitic resistance regions form.

After completion of the first step in the RTP anneal, the ambient is changed to 100% $N_2$ and annealing continued for an additional 10 to 40 seconds with 20 seconds preferred at a temperature in the range of 850 to 1500° C. with 950° C. preferred. The second step of the RTP causes diffusion of impurities from silicon or silicon alloy 320 into intrinsic silicon 308 and resultant formation of the source/drain junction. It is to be appreciated that the two steps of the RTP anneal preferably occur insitu (i.e.: the second anneal is done serially with, and in the same chamber as the first anneal step). Additionally any well known rapid thermal annealing equipment, such as but not limited to, an AG Associates Rapid Thermal Processor, can be utilized to conduct the RTP anneal. It its to be appreciated that the RTP anneal process is the only front end (prior to silicide formation) high temperature processor used to activate and drive all of the implants and impurity diffusions in the present invention. No other high temperature furnace anneals are utilized to drive/activate the implanted regions in drive dope and diffusion.

Figure 3G:
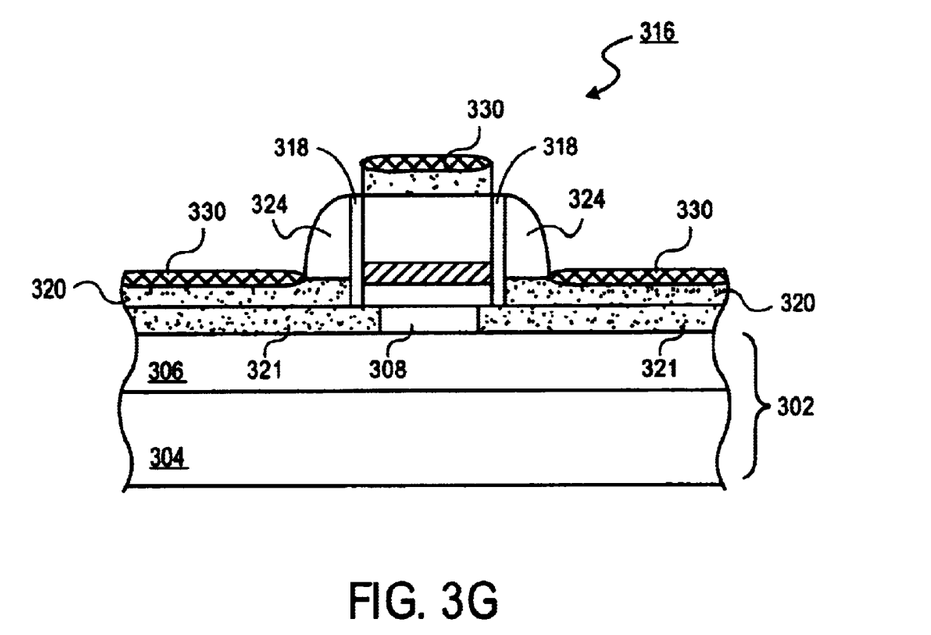

Next, shown in FIG. 3G, silicide 330 can be formed by a self-aligned silicide process (Salicide) onto deposited silicon alloy 320 adjacent to the outside edge of thick sidewall spacers 324 and on silicon or silicon alloy 320 formed on the top of gate electrode 316. In one type of silicide process, a titanium layer is first blanket deposited over the entire substrate. The device is then temperature cycled to cause a reaction between the deposited titanium layer and any exposed silicon surfaces (e.g., silicon alloy 320) to form titanium silicide 330. (i.e. TiSiX) It is to be appreciated titanium does not react with the dielectric sidewall spacers 324 and 318. Next a selective etch is used to remove the unreacted titanium from the sidewall spacers 324 and 318 and to leave titanium silicide 330. It is to be appreciated that other refractory metals such as tungsten, nickel, cobalt, and palladium and other processes can be used to form silicide 330. Additionally, it is to be noted that sidewall spacers 324 must be formed thick enough to prevent silicide encroachment from electrically shorting the gate electrode 316 to the source/drain contact regions. Additionally it is to be appreciated that silicide can be selectively deposited onto exposed silicon surfaces instead of using described salicide process if desired.

At this point the process for the fabrication of the novel transistor in accordance with the present invention is complete. Conventional well-know processes can now be utilized to interconnect the various transistors formed on substrate 302 into functional circuits to form integrated circuits such as microprocessors memories.

We claim:

1. A transistor comprising:
    an intrinsic silicon body;
    a gate dielectric on said first surface of said intrinsic silicon body;
    a gate electrode formed on said gate dielectric, said gate electrode comprising a mid-gap work function film having a thickness of less than or equal to 100 Å on said gate dielectric and a doped polysilicon film having a thickness of around 1000 Å on said mid-gap work function film;
    a pair of sidewall spacers adjacent to opposite sides of said gate electrode; and
    a pair of raised source/drain regions on opposite sides of said intrinsic silicon body and said pair of sidewall spacers,
    wherein said intrinsic silicon body having a first surface and a thickness of less than 500 Å formed on an insulating substrate.

2. The transistor of claim 1 wherein said intrinsic silicon body has a thickness less of less than 100 Å.

3. The transistor of claim 1 wherein said pair of raised source/drain regions comprise a silicon or silicon alloy formed above said first surface of said intrinsic silicon body.

4. The transistor of claim 3 wherein said silicon or silicon alloy is an epitaxial silicon or silicon alloy film.

5. The transistor of claim 4 wherein said silicon or silicon alloy is silicon germanium.

6. The transistor of claim 1 wherein said insulating substrate is selected from the group consisting of silicon dioxide on silicon, diamond, sapphire, non conducting polymers, quartz, gallium arsenide, and wide band gap semiconductors.

7. The transistor of claim 1 wherein said mid-gap work function film has a work function between 4.65 eV to 4.9 eV.

8. The transistor of claim 1 wherein said mid-gap work function film is selected from the group consisting of titanium nitride, tungsten, titanium, molybdenum, tantalum, and metallic silicides.

* * * * *